United States Patent [19]
Ghandehari et al.

[11] Patent Number: 5,952,135
[45] Date of Patent: Sep. 14, 1999

[54] METHOD FOR ALIGNMENT USING MULTIPLE WAVELENGTHS OF LIGHT

[75] Inventors: Kouros Ghandehari, San Jose; Satyendra S. Sethi, Pleasanton; Daniel C. Baker, Milpitas, all of Calif.

[73] Assignee: VLSI Technology, San Jose, Calif.

[21] Appl. No.: 08/974,203

[22] Filed: Nov. 19, 1997

[51] Int. Cl.$^6$ ........................................................ G03F 9/00
[52] U.S. Cl. ................................................. 430/22; 430/30
[58] Field of Search ......................................... 430/22, 30

[56] References Cited

U.S. PATENT DOCUMENTS

| | | | |
|---|---|---|---|
| 4,355,892 | 10/1982 | Mayer et al. | 355/77 |
| 4,795,244 | 1/1989 | Uehara et al. | 356/401 |
| 4,901,109 | 2/1990 | Mitome et al. | 355/68 |
| 5,137,363 | 8/1992 | Kosugi et al. | 356/401 |
| 5,150,173 | 9/1992 | Isobe et al. | 356/401 |
| 5,381,210 | 1/1995 | Hagiwara | 355/53 |

OTHER PUBLICATIONS

Heavens, O.S., Ph.D., "Optical Properties of Thin Solid Films," Dover Publications, Inc., New York, pp. 63–80 (1991).

*Primary Examiner*—Christopher G. Young

[57] ABSTRACT

A method and apparatus for the alignment of a semiconductor device in preparation for patterning a layer of the device includes using an alignment apparatus which has one or more light sources for producing light at two or more alignment wavelengths. Typically, the semiconductor device will include alignment structures that are to be aligned with corresponding alignment markers on a photomask which contains the desired pattern. The alignment structures on the semiconductor device are often depressions or trenches in a layer of the device. The alignment apparatus determines the position of the alignment structures by observing the contrast in the intensity of light reflected off the region of the device containing the alignment structure and the region of the device adjacent to the alignment structure. This contrast in the intensity of light is wavelength dependent. By providing an alignment apparatus with multiple alignment wavelengths, it is likely that at least one of those wavelengths will provide sufficient contrast to accurately resolve the alignment structures.

19 Claims, 6 Drawing Sheets

(a)

(b)

(c)

METHOD FOR ALIGNMENT USING MULTIPLE WAVELENGTHS OF LIGHT

FIELD OF THE INVENTION

The present invention is generally directed to a method of aligning a wafer. More particularly, the present invention relates to alignment of a wafer having a photoresist layer provided over relatively planar structural layers using an illumination device capable of producing multiple wavelengths of light.

BACKGROUND OF THE INVENTION

The manufacturing of integrated circuits (ICs) requires many process steps which are executed with precision and accuracy. Precision is important in that the ultimate dimensions of the components of integrated circuits are becoming smaller and smaller, on the order of less than one micron. Accuracy is important so that the related process steps are repeatable over time and produce results within a controlled range.

A significant part of many wafer manufacturing processes includes photolithography. Photolithography involves making an image of a part of the electronic circuit, rendering this part of the circuit onto a photographic plate, sometimes referred to as a photomask; and using the photomask and a light source to print that image onto a silicon wafer upon which a light-sensitive emulsion, or a photoresist, has been applied. The exposed photoresist is developed to reveal the desired circuit elements.

Other processes and treatments complete the layer for a given part of the electronic circuit. A given electronic circuit may have a number of photolithographic steps. The number of photolithographic steps often increases as circuits become more and more complex.

Two devices used for printing a mask pattern onto a silicon wafer are the projection aligner and the stepper.

FIG. 1a shows an example of a projection aligner's view of the alignment structure. In projection aligner printing, typically all of the product die on the wafer are printed simultaneously. For example, if a wafer substrate has the capacity to hold 150 die, the mask will have 150 images on it. In one typical projection aligner system, for example, the optical system includes two reflecting surfaces. The light, typically, supplied by a high energy source (e.g., a mercury lamp), passes through a point on the photomask to a primary mirror. The light bounces off the primary mirror onto a secondary mirror. From the secondary mirror, it again bounces back to the primary mirror. Here the image on the photomask is projected onto the wafer substrate. To assure accurate alignment, the device relies upon receiving a reflected light signature of the wafer substrate's alignment target so that it can be aligned with the photomask's corresponding marks.

One or more of these alignment structures are placed about a silicon wafer substrate to aid in aligning the plurality of photolithography steps used in a typical sub-micron process to manufacture a semiconductor device. Subsequent layers' photomasks have alignment structures on them which correspond to those structures printed previously on the silicon wafer substrate. Consequently, inter-layer alignment is maintained throughout the building of the semiconductor device.

FIG. 1b shows an application of an example embodiment in a photolithography process which uses steppers. In using steppers, one pattern of a layer of the semiconductor device is placed on a reticle. The image on the reticle may be about 5 times larger than the final printed image on the wafer. The stepper optics reduce the size of the reticle image to the final device size. As a wafer is printed, the stepper aligns to the previously printed die. The wafer steps along and the aligner prints one die at a time. Each die has at least one of the alignment structures to assure alignment throughout the building of the semiconductor device.

Each step builds an additional layer of the circuit upon the previously built ones. To assure that the layers line up with one another, the subsequent layers are printed relative to the first.

Alignment structures are sometimes included with the electronic circuit as part of its set of photomasks. These structures enable the alignment apparatus to reference correctly the current mask's image with the previously printed patterns on the wafer substrate. Typically, the alignment apparatus measures the reflected light off the surface topography of the alignment structure of the wafer. This reflected light "signature" enables the instrument to properly reference the subsequent photomask's alignment structure to the alignment structures on the wafer, thereby permitting proper connections between the circuits.

Conventional alignment methods rely upon topographical changes in the photoresist layer and the underlying device layers for detection of the alignment structures and accurate determination of the position of those structures. Often, the alignment structures are depressions or trenches made in one or more layers on the wafer. Photoresist is conformally deposited over the wafer and therefore matches the topography of the underlying layers. This typically results in a sloped topography around the perimeter of the depressions. Light from an alignment apparatus is typically directed normal to the flat surface of the wafer. This light is reflected back to the alignment apparatus, where the reflected light is detected. However, when light from the alignment apparatus is directed at the sloped regions it is incident at an angle less than 90° due to the sloped surface and therefore is not reflected directly back to the alignment apparatus. Thus, the edges of the depression are marked by a decrease in reflected light at the detector of the alignment apparatus.

Modern processing techniques, however, typically planarize the surfaces of some or all of the layers as they are deposited. Planarization of the layers is often achieved by chemical or mechanical methods. A common method of planarization is chemical-mechanical polishing (CMP). When the preceding layers are planarized, a photoresist applied over the layers has a relatively planar topography. This makes the alignment process more difficult because there is no photoresist or device topography which alters the angle of incidence of the incoming light and causes a change in the amount of light reflected back to the detector.

SUMMARY OF THE INVENTION

Generally, the present invention relates to a method of manufacturing semiconductor devices, which have planarized layers. This method is particularly useful for the mechanical alignment of lithography equipment when conventional methods based on specular reflection or scattering are not accurate. One embodiment is directed to a method of aligning a wafer in preparation for patterning a layer formed on the wafer. The method includes forming an alignment structure in the wafer and then forming a device layer over the wafer. The device layer has a relatively planar surface. A photoresist layer is subsequently formed over the device layer. The wafer is then aligned through observation of light reflected off the alignment structure. The light is produced by an illumination device which includes one or more light sources to produce light at two or more alignment wavelengths.

Another embodiment relates to a method of aligning a wafer in preparation for patterning a layer formed on the wafer. The method includes forming an alignment structure in a first layer of the wafer and then forming a second layer over the first layer. A portion of the second layer is removed to form a relatively planar surface. A photoresist layer is then formed over the second layer. The wafer is aligned through observation of light reflected off the alignment structure. The light is produced by an illumination device which includes one or more light sources capable of producing light at two or more alignment wavelengths.

A further embodiment is a semiconductor wafer made using either of these methods.

Another embodiment is directed to an apparatus for alignment of a wafer according to at least one alignment marker on the wafer. The apparatus includes at least one light source for producing light at least two alignment wavelengths. The light from the at least one light source is directed toward the wafer to illuminate the at least one alignment marker. A detector receives light reflected off the wafer. The apparatus also includes a processor which tests each of the at least two alignment wavelengths at least until there is a predetermined amount of contrast between light reflected from a region of the wafer containing the at least one alignment marker and light reflected from a region of the wafer adjacent to the at least one alignment marker.

An additional embodiment is an apparatus for aligning a wafer according to at least one alignment marker on the wafer. The apparatus includes at least one light source for producing light at least two alignment wavelengths, the light being directed toward the wafer to illuminate the alignment markers. The apparatus also includes a processor arrangement. The processor arrangement has a detector for receiving and detecting light reflected off the wafer and an executable program. The executable program, when executed by the processor arrangement, causes the processor arrangement to perform the following steps for each of the at least two alignment wavelengths: (a) detecting reflected light from a first region of the wafer containing the at least one alignment marker and reflected light from a second region of the wafer adjacent to the at least one alignment marker, (b) comparing the detected reflected light from the first and second regions, and (c) determining therefrom whether a threshold of the contrast between the detected reflected light of the first and second regions is exceeded. These steps are performed at least until the processor arrangement determines that the threshold has been exceeded.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
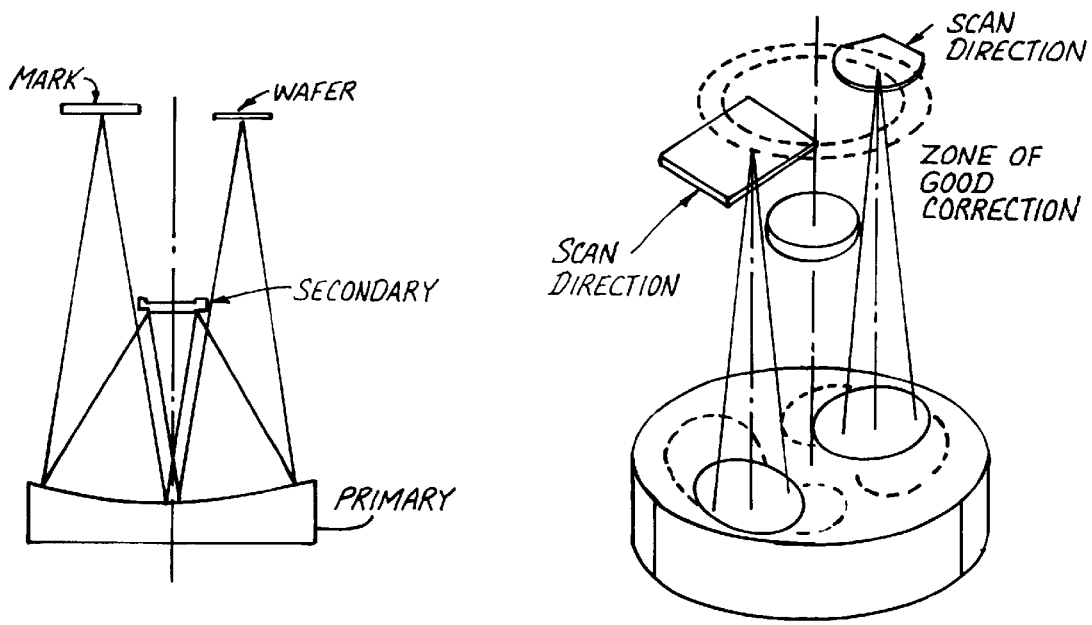
FIGS. 1a and 1b respectively illustrate a conventional projection aligner and a conventional stepper in accordance with an aspect of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE PREFERRED EMBODIMENT

The present invention is believed to be applicable to the alignment of semiconductor wafers for photolithographic patterning. In particular, the present invention is directed to aligning semiconductor wafers using an alignment apparatus which can provide light at two or more different alignment wavelengths. While the present invention is not so limited, an appreciation of various aspects of the invention will be gained through a discussion of the examples provided below.

Figure 2:
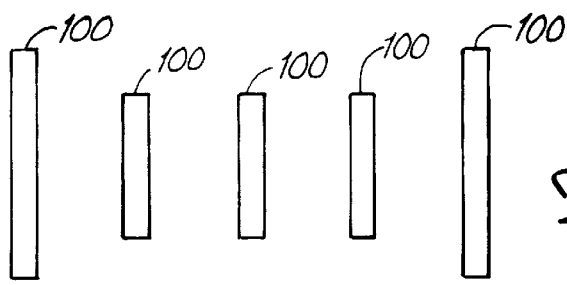
FIG. 2 illustrates one example of an alignment structure.

FIG. 2 illustrates a series of alignment structures 100. There may be one or more alignment structures on a wafer.

In some embodiments, the alignment structures 100 are provided for each die on the wafer. This configuration is particularly suitable when a stepper device is used to sequentially pattern the dies photolithographically.

These alignment structures 100 may be placed at any position on the semiconductor wafer. Preferably, however, the alignment structures are placed on a portion of the wafer which does not or will not contain circuitry or active regions. For example, the alignment structures may be placed near an edge, at a corner of a semiconductor wafer, or at or near the scribe lines between the dies on the wafer. In addition, alignment structures may be made in different layers on the wafer for alignment of succeeding layers.

Figure 3:
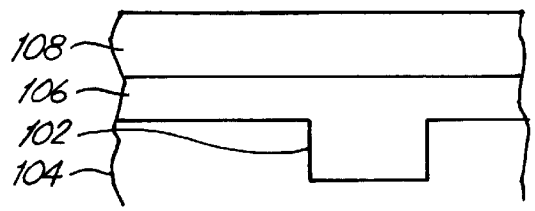
FIG. 3 is a cross-section of an exemplary semiconductor device with an alignment mark.
Figure 4A:
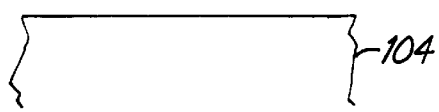
FIGS. 4a–4d are cross-sections of exemplary steps in a fabrication process of the semiconductor device of FIG. 3.
Figure 4B:
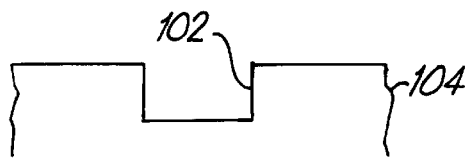

The alignment structures 100 can be formed in a variety of ways. One particular alignment structure is a depression or trench 102, as illustrated in FIG. 3. The trench 102 is formed in a first layer 104 of the wafer, as illustrated in FIGS. 4a and 4b. The first layer 104 can be the substrate of the wafer. Alternatively, the first layer 104 may be any layer of material formed over the substrate, such as a dielectric material or conducting material. There may be several intervening layers between the substrate and the first layer 104. The trench 102 can be formed by a variety of techniques. For examples, the trench can be formed by well-known photolithography and etching techniques.

Figure 4C:
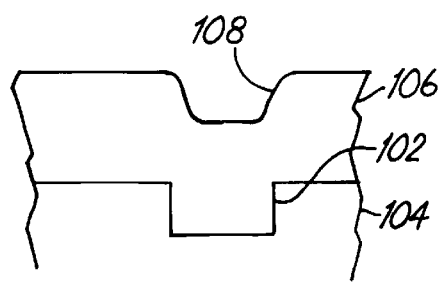

A second layer 106 is formed over the first layer 104, as shown in FIG. 4C. The second layer 106 may be, for example, a dielectric or metal layer. The second layer 106 typically fills the trench 102 and can be formed by a variety of methods, including for example, chemical vapor deposition (CVD) or physical deposition. In some embodiments, there is another layer (not shown) formed between the first and second layers 104, 106. For example, a thermal oxide layer may be grown over the first layer 104 prior to the formation of the second layer 106.

Figure 4D:
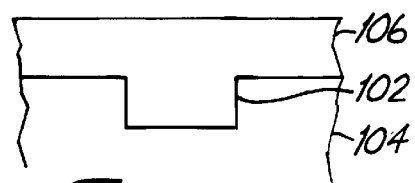

The second layer 106 is often conformally deposited, especially when the second layer 106 is formed by CVD, as shown in FIG. 4c. This results in a layer having a depression 108 corresponding to the trench 102. Conventional processing techniques sometimes require the smoothing of deposited layers to form relatively planar surfaces. This smoothing or planarization can be accomplished by a variety of techniques, including, for example, chemical or mechanical polishing. One common method for planarizing layers on a semiconductor wafer is a combination of these techniques and is commonly known as chemical-mechanical polishing (CMP). These methods leave the second layer 106 with a relatively smooth, planar surface, as shown in FIG. 4d. Although the second layer 106 is planarized, there may be some variation in the thickness of the second layer 106, for example, a small uniform thickness increase across the width of the sample.

Referring again to FIG. 3, a photoresist layer 108 is formed over the second layer 106 in preparation for patterning the second layer 106 (and/or other layers (not shown) that are formed over the second layer 106). The photoresist layer 108 may be formed by a variety of techniques including, for example, chemical vapor deposition (CVD), physical deposition, or spin coating. A variety of photoresists can be used. The particular photoresist that is used may depend, for example, on the layers being patterned and the wavelength of light that is used to pattern features in the photoresist. The smaller the features, the shorter the wavelength of light that is required to obtain the needed pattern resolution. An effective photoresist is typically chemically altered by interaction with light having the patterning wavelength, thus the particular photoresist may depend on the size of the features which will be patterned.

Often, the photoresist layer 108 is formed approximately conformally over the second layer 106. However, there may be some variation in the thickness of the photoresist layer 108. This variation in photoresist thickness can have a negative impact on the resolution of alignment structures, as described in detail below.

After the photoresist is formed, the wafer is aligned with a photomask which is used to pattern one or more layers on the wafer. To align the wafer and photomask, light from an illumination device is directed toward the wafer. The illumination device may be part of an apparatus for patterning the photoresist or the illumination device may be provided separately. The light from the illumination device typically has a wavelength which does not chemically or physically alter the photoresist during the alignment procedure (i.e., the alignment light does not include light having a patterning wavelength). Light which does chemically or physically alter the photoresist may be used if exposure during the alignment process is of such short duration that the light does not cause substantial alteration of the photoresist.

Figure 5:
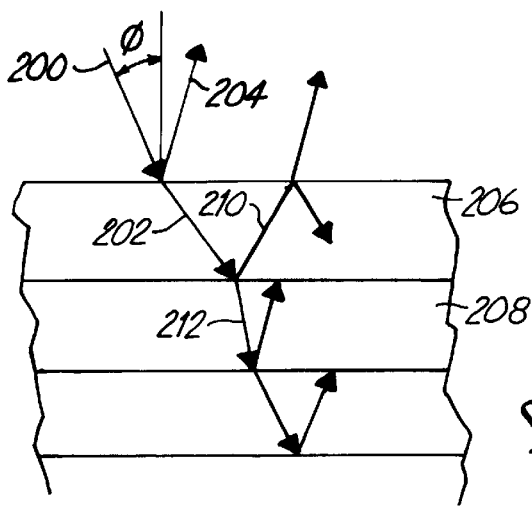
FIG. 5 is a cross-section of a multilayered semiconductor device illustrating the reflection and transmission of light through the layers of the device.

When light illuminates a structure which includes two or more thin layers of material such as the first and second layers 104, 106 and the photoresist layer 108, there is a complex interaction between the transmitted and reflected light, as illustrated in FIG. 5. Although the light from an illumination device is often directed normally to the surface of the wafer and photoresist, the example in FIG. 5 is illustrated with incident light that is directed at the surface of the wafer at an angle less than normal for clarity. It will be appreciated that response of light directed normally or at any other angle to the surface of the wafer can be diagramed in a manner similar to FIG. 5.

The incident light 200 from the illumination device will be partially transmitted 202 and partially reflected 204 by the surface of a first layer 206 (e.g., a photoresist layer). The relative amounts of reflected 204 and transmitted 202 light will depend on the angle, $\phi$, of incidence and the index of refraction, $n_1$, of the first layer 206. The transmitted light 202 will travel to the interface between the first layer 206 and a second layer 208 where a portion of the transmitted light will be reflected 210 back toward the top surface of the first layer 206 and another portion will be transmitted 212 into the second layer. Again, the relative amounts of transmitted and reflected light will depend on the angle of incidence of the light at the interface and the relative indices of refraction, $n_1$, $n_2$, between the two layers 206, 208. This splitting of the light into a transmitted portion and a reflected portion will occur each time the light encounters an interface. Only a small number of the actual light paths are illustrated in FIG. 5.

In addition to being reflected and transmitted, the light may be absorbed by the material of the various layers. The absorption of light is typically proportional to $e^{-kz}$, where z is the thickness of the layer (or more correctly the distance the light travels through the layer) and k is the extinction coefficient. The end result of this analysis is a complicated set of equations which can be used to calculate the amount of light reflected from the wafer. The calculations are well-known and are described, for example, in O. S. Heavens, *Optical Properties of Thin Solid Films*, p. 63–80 (Dover Publications, Inc., New York, 1991), incorporated herein by reference.

Figure 6:
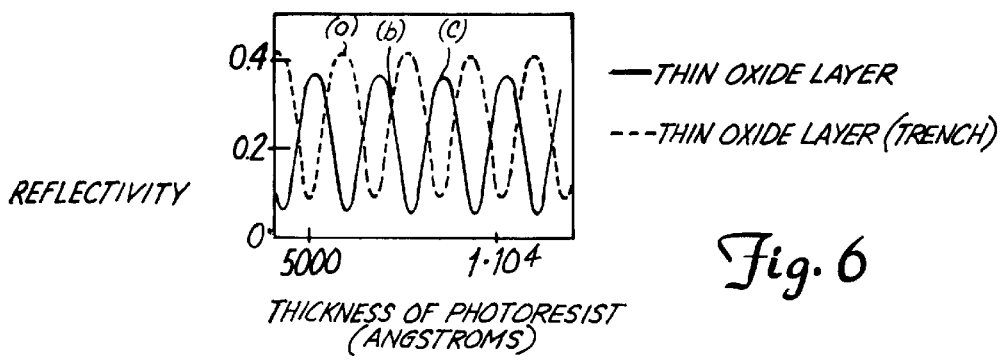
FIG. 6 is a graph of reflectivity versus photoresist thickness for the semiconductor device of FIG. 3 for two values of oxide layer thickness.

The reflectivity of the wafer will depend on the thickness of the layers on the wafer and the types of materials which are used. FIG. 6 is a representative graph of reflectivity versus the thickness of a photoresist layer for two portions of a wafer with different oxide layer thickness. The thickness of all of the other layers is held constant. In particular, FIG. 6 is a calculation of reflectivity for the wafer of FIG. 3 which includes a silicon substrate 104 having a trench 102 that is covered by a silicon dioxide layer 106 and a photoresist layer 108. The dotted line corresponds to the reflectivity of the wafer in the trench regions. The other line corresponds to the reflectivity of the wafer over the rest of the substrate where no trench has been formed. The difference between the reflectivities of the two lines at a given resist thickness represents the contrast of the reflected light between the alignment structure and the adjacent regions of the wafer. The larger the difference, the better the contrast between the alignment structures and the adjacent portions of the wafer.

Figure 1B:
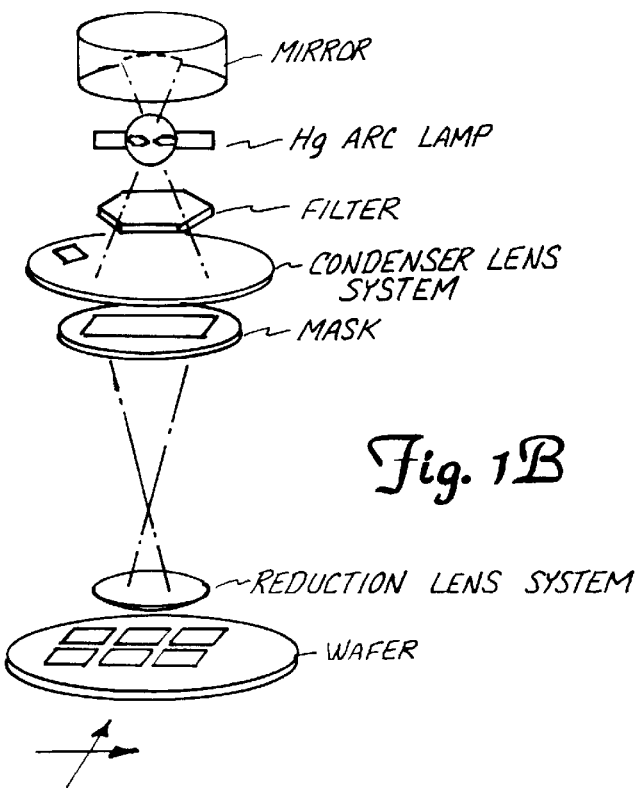
Figure 7:
FIG. 7 is a graph of intensity versus position of the alignment markers for three different thicknesses of photoresist according to FIG. 6.
Figure 7:
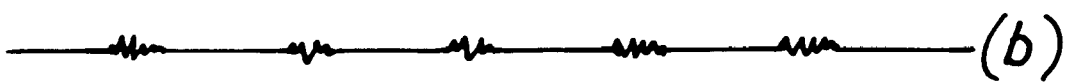
Figure 7:

Three characteristic examples of the reflectivity of a wafer for different photoresist thicknesses are indicated at points (a), (b), and (c) in FIG. 6. FIG. 7 is a graphical representation of the intensity of light that would be found along an alignment structure with five trenches, similar to that of FIG. 1. At point (a) in FIG. 6, the intensity of light reflected from the trench regions is at a maximum and the intensity of light reflected from portions of the wafer adjacent to the trench is much less. At point (c) in FIG. 6, the intensity of the reflected light from regions adjacent to the trench is at a maximum and the intensity of the reflected light from the trench regions is much less. Both points (a) and (c) may provide sufficient contrast in the intensity of the reflected light between the alignment structure and adjacent regions to permit accurate alignment of the wafer.

Point (b) of FIG. 6, however, illustrates a significant problem. For certain photoresist thicknesses, the intensity of light reflected from the two different regions of the wafer may be the same or nearly the same. In this case, the alignment structures can not be resolved. One potential solution to this problem is to ensure that the photoresist has a thickness that permits resolution of the alignment structures. However, this may not always be possible. As indicated previously, the photoresist thickness can not always be sufficiently controlled to provide a uniform or precise thickness. Furthermore, it is often the case that a particular resist thickness is necessary for a particular structure or process.

Instead of relying on the particular choice of photoresist layer thickness, an illumination device which is capable of producing light at two or more alignment wavelengths, as described hereinabove, can be provided. Often, the index of refraction and extinction coefficient of the individual layers of the semiconductor wafer are wavelength dependent. Thus, the reflectivity of the wafer may vary depending on the wavelength of the alignment light.

Figure 8A:
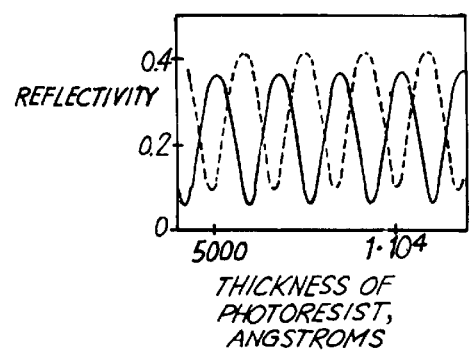
FIGS. 8a–8c are graphs of reflectivity versus photoresist thickness for an exemplary semiconductor device at 540, 633, and 1100 nm, respectively.
Figure 8B:
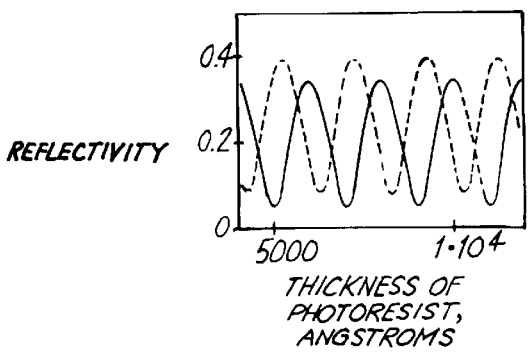
Figure 8C:
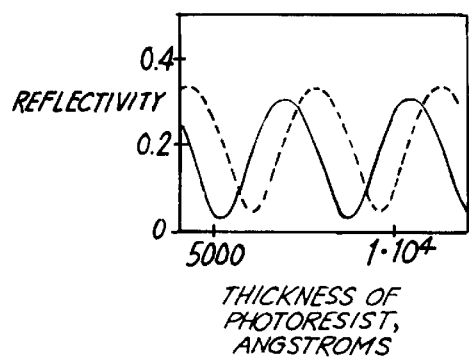

FIGS. 8a–8c illustrate this frequency dependence of the reflectivity for a silicon wafer 104 having a structure similar to FIG. 3 with a trench 102, a silicon dioxide layer 106, and a photoresist 108. FIGS. 8a–8c are graphs of the reflectivity of the trench portions of the wafer (dotted lines) and adjacent portions of the wafer (solid line) at 540 nm, 633 nm, and 1100 nm, respectively. Table 1 presents the parameters used to calculate these curves.

TABLE 1

| | Thickness, | Index of Refraction, n | | | Extinction Coefficient, k | | |
|---|---|---|---|---|---|---|---|
| | Angstroms | 540 nm | 633 nm | 1100 nm | 540 nm | 633 nm | 1100 nm |
| Silicon | a | 4.123 | 3.882 | 3.536 | 0.044 | 0.019 | 0.00025 |
| Silicon dioxide | 45[b] 3000[c] | 1.460 | 1.457 | 1.448 | 0 | 0 | 0 |
| Photoresist | d | 1.5734 | 1.5734 | 1.5734 | 0 | 0 | 0 |

[a]It is assumed that all of the light is reflected by the silicon substrate, so no thickness is needed.
[b]The thickness of the silicon dioxide layer over the trench.
[c]The thickness of the silicon dioxide layer over the regions adjacent to the trenches.
[d]Variable (This is the x-axis of FIGS. 8a–8c)

There will typically be alignment problems when the solid and dotted curves cross on each graph. For example, in FIG. 8a (540 nm light) the curves cross at about 5500 angstroms. There will typically be insufficient contrast in the reflected light to resolve the alignment structures using 540 nm light when the photoresist thickness is 5500 angstroms. However, there may be sufficient contrast if the alignment wavelength is changed to 633 nm, where the difference in reflectivity is about 20–30%. Thus, by having an alignment apparatus capable of producing light at multiple alignment wavelengths, it is likely that, for at least one wavelength, the reflected light will provide sufficient contrast to resolve the alignment structures.

Figure 9:
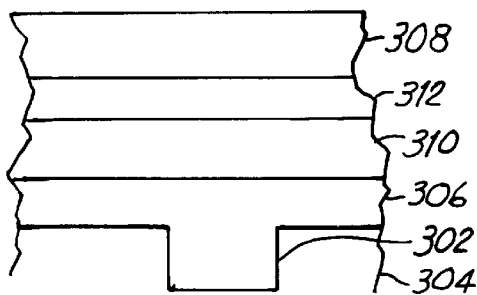
FIG. 9 is a cross-section of another exemplary semiconductor device.

FIG. 9 illustrates a more complicated wafer structure. In this case, a trench 302 is formed in a silicon substrate layer 304. A silicon dioxide layer 306 is formed over the substrate layer 304 and fills the trench 302. A polysilicon layer 310 is formed over the silicon dioxide layer 306 and is followed by a silicon oxynitride layer 312 which forms a dielectric layer. This is then covered by a photoresist 308. In this case, the polysilicon layer 308 and silicon oxynitride layer 312 will be patterned. Parameters for the calculation of reflectivity vs. photoresist thickness are given in Table 2 and results for 540 nm, 633 nm, and 1100 nm are provided in FIGS. 10a–10c, respectively.

TABLE 2

|  | Thickness, | Index of Refraction, n | | | Extinction Coefficient, k | | |
| --- | --- | --- | --- | --- | --- | --- | --- |
|  | Angstroms | 540 nm | 633 nm | 1100 nm | 540 nm | 633 nm | 1100 nm |
| Silicon | a | 4.123 | 3.882 | 3.536 | 0.044 | 0.019 | 0.00025 |
| Silicon dioxide | 45[b] 3000[c] | 1.460 | 1.457 | 1.448 | 0 | 0 | 0 |
| Polysilicon | 2500 | 4.46 | 4.21 | 3.58 | 0.83 | 0.421 | 0.042 |
| Silicon oxynitride | 280 | 2.10 | 2.031 | 1.85 | 0.04 | 0.024 | 0 |
| Photoresist | d | 1.5734 | 1.5734 | 1.5734 | 0 | 0 | 0 |

Figure 10A:
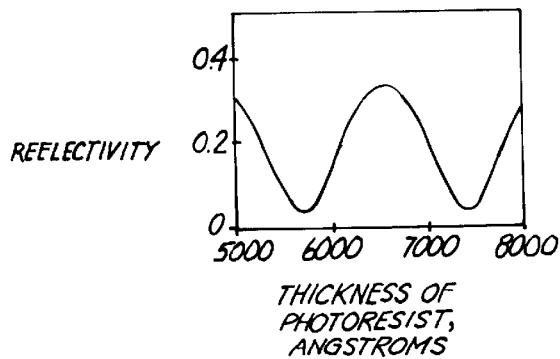
FIGS. 10a–10c are graphs of reflectivity versus photoresist thickness for the exemplary semiconductor device of FIG. 9 at 540, 633, and 1100 nm, respectively.
Figure 10B:
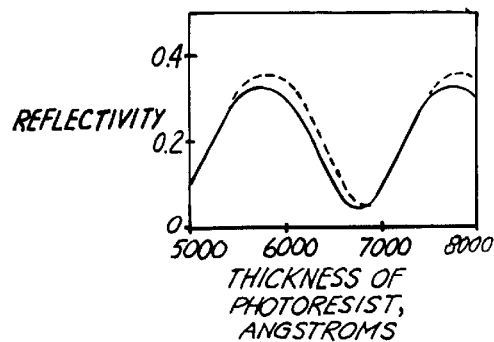
Figure 10C:
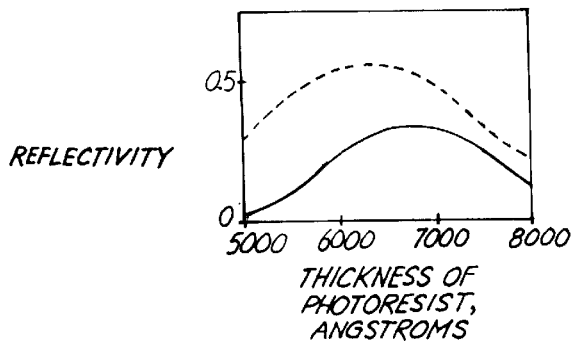

[a]It is assumed that all of the light is reflected by the silicon substrate, so no thickness is needed.
[b]The thickness of the silicon dioxide layer over the trench.
[c]The thickness of the silicon dioxide layer over the regions adjacent to the trenches.
[d]Variable (This is the x-axis of FIGS. 10a–10c.)

This particular example illustrates the difficulties that can arise in detecting alignment structures. As shown in FIG. 10a, light having a wavelength of 540 nm will not be able to resolve the alignment structures because of the nearly uniform reflectivity between the regions of the wafer that contain the alignment structures and those regions that are adjacent to the alignment structures. There is no contrast between these two different regions at any photoresist thickness. Light having a wavelength of 633 nm helps little in resolving the structures. There is at best only a small difference (<3%) in reflectivity between the two regions over this photoresist thickness range.

In contrast, light having a wavelength of 1100 nm provides significant contrast in reflected light intensity between the two individual regions, particularly for photoresist thicknesses between about 5000–6500 angstroms. Over this region the difference in reflectivity is about 15–40%. This illustrates the versatility of a system with more than one alignment light source. A user can choose between light sources to find the best contrast for aligning the wafers.

Figure 11:
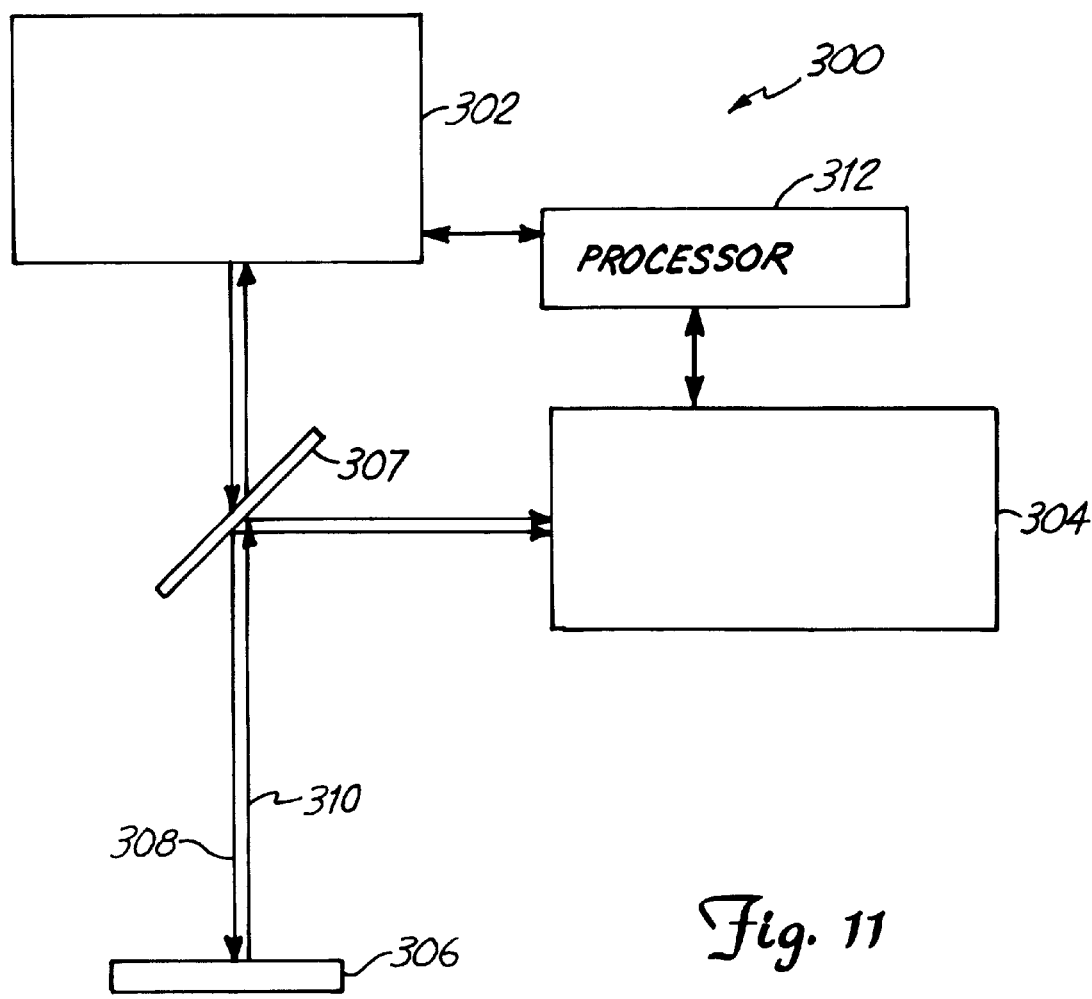
FIG. 11 is a diagrammatic representation of an illumination apparatus according to the invention.

In operation, the alignment apparatus 300 includes a light detector 302 and one or more light sources 304 for producing light at two or more alignment wavelengths, as diagrammatically illustrated in FIG. 11. It will be understood that the illustrated blocks can be discrete or part of the same unit. The light sources 304 are directed to illuminate a wafer 306 with light 308. The detector 302 receives light 310 reflected from the wafer 306. The detector 302 also typically receives an image of the photomask (not shown) which includes alignment markers. The alignment markers from the wafer 306 and photomask are aligned based on the light received at the detector 302.

The light 308 may be directed to illuminate the entire wafer 306 or may be directed to illuminate only a portion of the wafer, such as an individual die. In addition, the detector 302 may be configured to receive light 310 from the entire wafer, or the detector may be restricted to receiving light from only a portion of the wafer. For example, optical devices 307, such as lenses or mirrors, may be provided which focus reflected light from only one portion of the wafer onto the detector 302. A control system 312 may be used to control the light source and/or detector to determine which region of the wafer is illuminated or from which region of the wafer reflected light is received by the detector. This may be accomplished by moving the light source, detector, or other optical devices, such as lens and/or mirrors, which can be used to direct either illumination or reflected light to the proper positions.

The alignment apparatus may also be part of an automated system operated by a processor-based control system, e.g., item 312. The automated system includes a processor 312 which tests the alignment wavelengths and searches for signals having a threshold contrast level. The processor 312 may be directed to search in a particular portion of the wafer (e.g., on the sides, on a corner, or in the scribe lines between dies) for the alignment markers. The processor 312 may, for example, stop when a threshold level has been found or the processor may continue through all of the alignment wavelengths. The processor 312 may select one or more of the wavelengths which display sufficient contrast for viewing by a user or the processor may use the alignment markers to automatically align the wafer and the photomask. The processor 312 may also test each of the alignment wavelengths for each die.

The processor 312 may contain an executable program which, when executed, tests each alignment wavelength by, first, causing the detector to detect reflected light from a region of the wafer containing the alignment markers and a region of the wafer adjacent to the alignment markers. The program then compares the detected light and determines if a contrast threshold has been exceeded. The processor 312 continues at least until the processor determines that the threshold has been exceeded. The processor 312 may stop at this point or the processor may continue to test the other alignment wavelengths.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification. The claims are intended to cover such modifications and devices.

We claim:

1. A method of aligning a wafer in preparation for patterning a layer formed on the wafer, the method comprising:

forming an alignment structure in the wafer;

forming a device layer over the alignment structure in the wafer;

planarizing the device layer;

forming a photoresist layer over the device layer;

illuminating the wafer with a plurality of alignment wavelengths in respective steps after forming the photoresist layer;

determining which one or more of the plurality of alignment wavelengths produces a contrast level that meets a predetermined threshold, wherein the contrast level is between light reflected from the alignment structure and light reflected from areas adjacent to the alignment structure; and aligning the wafer through observation of light reflected off the alignment structure using one of the one or more of the plurality of alignment wavelengths from the determining step.

2. The method of claim 1, wherein forming the alignment structure comprises forming a trench in a layer of the wafer.

3. The method of claim 2, wherein forming a trench in a layer of the wafer comprises forming a trench in a substrate of the wafer.

4. The method of claim 1, wherein the photoresist layer is substantially photochemically inactive to light having the two or more alignment wavelengths.

5. The method of claim 1, wherein the one or more light sources are monochromatic light sources.

6. The method of claim 5, wherein the monochromatic light sources are lasers.

7. The method of claim 1, wherein the illumination device comprises a filter which filters light from a light source to leave a one of the two or more alignment wavelengths.

8. The method of claim 1, wherein the plurality of wavelengths include wavelengths of approximately 540 nm, 633 nm, and 1100 nm.

9. A semiconductor wafer made according to the process of claim 1.

10. A method of aligning a wafer in preparation for patterning a layer formed on the wafer, the method comprising:

forming an alignment structure in a first layer of the wafer;

forming a second layer over the first layer;

removing a portion of the second layer to form a relatively planar surface of the second layer;

forming a photoresist layer over the second layer; and illuminating the wafer with a plurality of alignment wavelengths in respective steps after forming the photoresist layer;

determining which one or more of the plurality of alignment wavelengths produces a contrast level that meets a predetermined threshold, wherein the contrast level is between light reflected from the alignment structure and light reflected from areas adjacent to the alignment structure; and aligning the wafer through observation of light reflected off the alignment structure using one of the one or more of the plurality of alignment wavelengths from the determining step.

11. The method of claim 10, wherein forming the alignment structure comprises forming a depression in the first layer.

12. The method of claim 10, wherein the first layer is a substrate of the wafer.

13. The method of claim 10, wherein the photoresist layer is substantially photochemically inactive to light having the two or more alignment wavelengths.

14. The method of claim 10, wherein removing a portion of the second layer comprises polishing the second layer to form a relatively planar surface.

15. The method of claim 14, wherein polishing the second layer comprises polishing the second layer chemically, mechanically, or a combination thereof.

16. The method of claim 10, wherein one or more layers separate the second layer and the photoresist layer.

17. The method of claim 10, wherein one or more layers separate the first and second layers.

18. The method of claim 10, wherein the second layer is a dielectric layer.

19. The method of claim 10, wherein the plurality of wavelengths include wavelengths of approximately 540 nm, 633 nm, and 1100 nm.

* * * * *

UNITED STATES PATENT AND TRADEMARK OFFICE
CERTIFICATE OF CORRECTION

PATENT NO.    : 5,952,135
DATED         : September 14, 1999
INVENTOR(S)   : Ghandehari et al.

It is certified that error appears in the above-identified patent and that said Letters Patent is hereby corrected as shown below:

Column 11,
Line 21, after "leave", please delete "a".

Signed and Sealed this

Second Day of July, 2002

Attest:

JAMES E. ROGAN
Attesting Officer  Director of the United States Patent and Trademark Office